(12) United States Patent
Hsu et al.

(10) Patent No.: US 11,855,073 B2
(45) Date of Patent: Dec. 26, 2023

(54) ESD STRUCTURE

(71) Applicant: Taiwan Semiconductor Manufacturing Company, Ltd., Hsinchu (TW)

(72) Inventors: Chun-Chia Hsu, Kaohsiung (TW); Tung-Heng Hsieh, Hsinchu County (TW); Yung-Feng Chang, Hsinchu (TW); Bao-Ru Young, Zhubei (TW); Jam-Wem Lee, Hsinchu (TW); Chih-Hung Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/936,965

(22) Filed: Sep. 30, 2022

(65) Prior Publication Data

US 2023/0029158 A1    Jan. 26, 2023

Related U.S. Application Data

(62) Division of application No. 16/996,986, filed on Aug. 19, 2020, now Pat. No. 11,532,607.

(51) Int. Cl.
*H01L 27/02* (2006.01)
*H01L 29/06* (2006.01)
*H01L 29/861* (2006.01)

(52) U.S. Cl.
CPC ...... *H01L 27/0255* (2013.01); *H01L 29/0692* (2013.01); *H01L 29/861* (2013.01)

(58) Field of Classification Search
CPC ............ H01L 27/0255; H01L 29/0692; H01L 29/861; H01L 29/417; H01L 29/165; H01L 29/0676; H01L 27/0266; H01L 29/78696; H01L 29/0673; H01L 29/66439; H01L 29/151; H01L 29/775; H01L 29/42392; H01L 29/41708; H01L 27/027; B82Y 10/00
See application file for complete search history.

(56) References Cited

U.S. PATENT DOCUMENTS

| | | |
|---|---|---|
| 6,737,682 B1 * | 5/2004 | Yu ....................... H01L 27/0262 257/350 |
| 9,209,247 B2 | 12/2015 | Colinge et al. |
| 9,236,267 B2 | 1/2016 | De et al. |

(Continued)

*Primary Examiner* — Wasiul Haider
(74) *Attorney, Agent, or Firm* — McClure, Qualey & Rodack, LLP

(57) ABSTRACT

Electrostatic discharge (ESD) structures are provided. An ESD structure includes a semiconductor substrate, a first epitaxy region with a first type of conductivity over the semiconductor substrate, a second epitaxy region with a second type of conductivity over the semiconductor substrate, and a plurality of first semiconductor layers and a plurality of second semiconductor layers. The first and second semiconductor layers are alternatingly stacked over the semiconductor substrate and between the first and second epitaxy regions. A first conductive feature is formed over the first epitaxy region and outside an oxide diffusion region. A second conductive feature is formed over the second epitaxy region and outside the oxide diffusion region. The oxide diffusion region is disposed between the first and second conductive features.

20 Claims, 9 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 11,075,273 B1 * | 7/2021 | Reznicek ............ H01L 21/0262 |
| 2014/0210003 A1 | 7/2014 | Ko et al. |
| 2019/0073440 A1 * | 3/2019 | Farbiz ................... G06F 30/392 |

\* cited by examiner

ESD STRUCTURE

CROSS REFERENCE TO RELATED APPLICATIONS

This Application is a Divisional of application Ser. No. 16/996,986, filed on Aug. 19, 2020, now U.S. Pat. No. 11,532,607, the entirety of which is incorporated by reference herein.

BACKGROUND

Electrostatic discharge (ESD) protection is provided to protect the internal circuitry of a semiconductor device in the presence of an electrostatic stress event, such as a static discharge that can occurs from contact with a human body, or a machine approaching an electrically isolated device or circuit board. ESD stress events may cause voltage in excess of the kilovolts range to be coupled to a pin of an integrated circuit (IC). Without ESD protection, the internal devices can be damaged or destroyed.

In ICs, ESD stress events must be protected against. ESD events occur when a charged object is placed in proximity to an IC device and static discharge occurs. The conductive leads on a packaged IC make an efficient surface for receiving electrostatic discharge. If the voltage stress that is caused by the discharge into a pin of the IC is not protected against, physical damage including breakdown, metal electromigration, gate oxide rupture, and other damage due to an ESD event stress may destroy or damage the physical devices within the IC.

Therefore, the ESD circuits that effectively provide efficient and effective ESD protection is important for the ICs.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
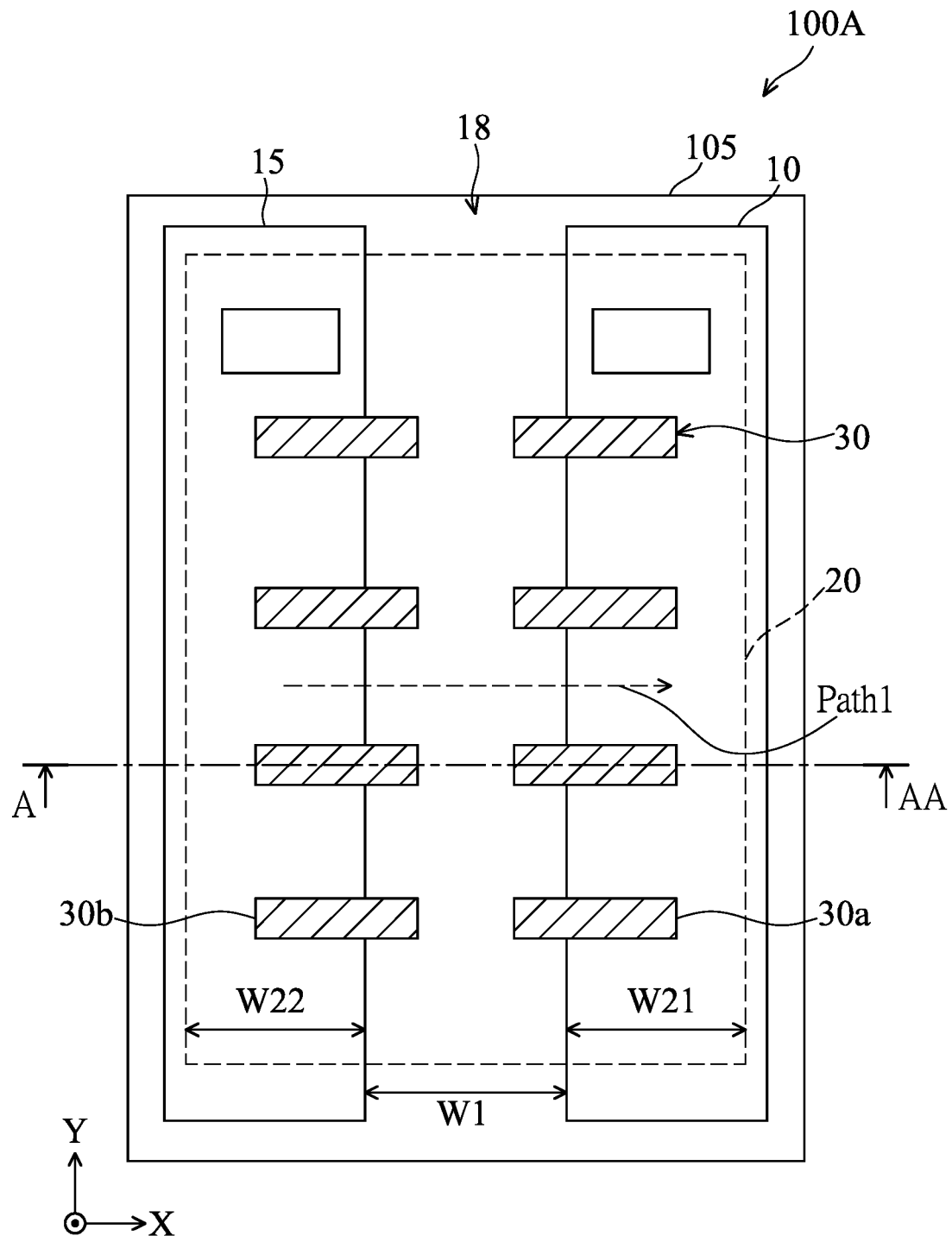
FIG. 1 shows a top view of a electrostatic discharge (ESD) device, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure will be described with respect to embodiments in a specific context, namely an electrostatic discharge (ESD) protection diode for GAA applications. The embodiments of the disclosure may also be applied, however, to a variety of ESD protection applications. Hereinafter, various embodiments will be explained in detail with reference to the accompanying drawings.

Semiconductor devices including transistors are susceptible to extremely high voltage spikes such as an electrostatic discharge (ESD) transient. ESD is a rapid discharge that flows between two objects due to the built-up of static charge. ESD may destroy semiconductor devices because the rapid discharge can produce a relatively large current. ESD protection structures are needed for the ICs. In ESD protection, an ESD circuit is formed near integrated circuit terminals such as input and output pads, and also for power supply terminals. ESD protection circuits may provide a current discharge path so as to reduce the number of semiconductor failures that occur as a result of ESD. In other words, ESD is a major factor related to the reliability of electronic devices. Proper ESD protection is necessary to protect the electronic device from damage by electrostatic discharge.

Semiconductor devices of ICs can be damaged by ESD events. Such ESD events can occur when static electricity is suddenly discharged from a body surface to a device. For example, during the manufacturing or testing of an IC, an ESD event can occur between an engineer's finger and a semiconductor wafer on which a semiconductor device is located, causing a sudden in-rush of current or voltage to strike the semiconductor device. This sudden in-rush of current or voltage can catastrophically damage the device in a number of ways, such as blowing out a gate oxide or causing junction damage, for example. ESD protection devices or circuits are used to protect against such ESD events taking place in the IC.

FIG. 1 shows a top view of a electrostatic discharge (ESD) device 100A, in accordance with some embodiments of the disclosure. The ESD device 100A is formed over a semiconductor substrate 105. The ESD device 100A includes a diode (not shown) for ESD protection. In some embodiments, the semiconductor substrate 105 is a Si substrate. In some embodiments, the material of the semiconductor substrate 105 is selected from a group consisting of bulk-Si, SiP, SiGe, SiC, SiPC, Ge, SOI-Si, SOI-SiGe, III-VI material, and combinations thereof.

A P-type epitaxy region 10 is formed over the semiconductor substrate 105, and the P-type epitaxy region 10 is configured as the anode of the diode. Furthermore, an N-type epitaxy region 15 is formed over the semiconductor substrate 105, and the N-type epitaxy region 15 is configured as the cathode of the diode. It should be noted that the P-type epitaxy region 10 is separated from the N-type epitaxy region 15 by a junction region 18. In the ESD device 100A, the width of the junction region 18 between the P-type epitaxy region 10 and the N-type epitaxy region 15 (e.g., along the X direction) is W1.

In some embodiments, the width W21 of the P-type epitaxy region 10 within an oxide diffusion (OD) region 20 along the X direction is greater than the width W1 of the junction region 18, i.e., W21>W1. Moreover, the width W22 of the N-type epitaxy region 15 within the OD region 20 along the X direction is greater than the width W1 of the junction region 18, i.e., W22>W1. In some embodiments, width W21 is different than width W22. In some embodiments, width W21 is equal to width W22.

The P-type epitaxy region 10 is coupled to a ground line through a contact (not shown in FIG. 1) that is formed within the OD region 20 and over the P-type epitaxy region 10. Moreover, the N-type epitaxy region 15 is coupled to a power line through another contact (not shown in FIG. 1) that is formed within the OD region 20 and over the B-type epitaxy region 15. In some embodiments, the OD region 20 is used as an active region for a transistor. In some embodiments, the OD region is defined by the shallow trench isolation (STI) regions of the ESD device 100A. In some embodiments, the contact is a metal to diffusion (MD) contact.

Multiple electrodes 30 are formed over the diode of the ESD device 100A. In some embodiments, the material of the electrodes 30 is similar to the metal gate of the transistors to be protected by the ESD device 100A, and the transistors and the ESD device 100A are formed over the semiconductor substrate 105 in the same IC. Furthermore, the electrodes 30 are formed within the OD region 20.

In some embodiments, a half of the electrodes 30 (labeled as 30a) are formed over the junction region 18 and the P-type epitaxy region 10. Furthermore, the remaining electrodes 30 (labeled as 30b) are formed over the junction region 18 and the N-type epitaxy region 15. In some embodiments, the electrodes 30 do not affect the function or operation of the diode of the ESD device 100A. For example, the electrodes 30 is arranged based on process considerations for subsequent processes, such as balance for chemical mechanical polishing (CMP) of the whole IC.

In some embodiments, the electrodes 30a and 30b are not formed over the junction region 18. For example, the electrodes 30a are formed only over the P-type epitaxy region 10 within the OD region 20, and the electrodes 30b are formed only over the N-type epitaxy region 15 within the OD region 20. In some embodiments, the electrodes 30 are formed outside the OD region 20.

ESD current path Path1 is a schematic representation to indicate how an electron diffusion current may be directed in an ESD event according to the embodiment shown in FIG. 1. In the ESD device 100A, the ESD current path Path1 represents a current that may be generated by an ESD event. The ESD current path Path1 flows from the N-type epitaxy region 15 which is considered to be at one electrical node, to the P-type epitaxy region 10 which is considered to be at another electrical node during the ESD event.

In some embodiments, when the area of the OD region 20 or the P-type epitaxy region 10 and the N-type epitaxy region 15 of the ESD device 100A is increased, the diode size of the ESD device 100A is increased. In some embodiments, the diode size of the ESD device 100A is increased by mirror the ESD device 100A in FIG. 1 along the X direction or the Y direction.

Figure 2:
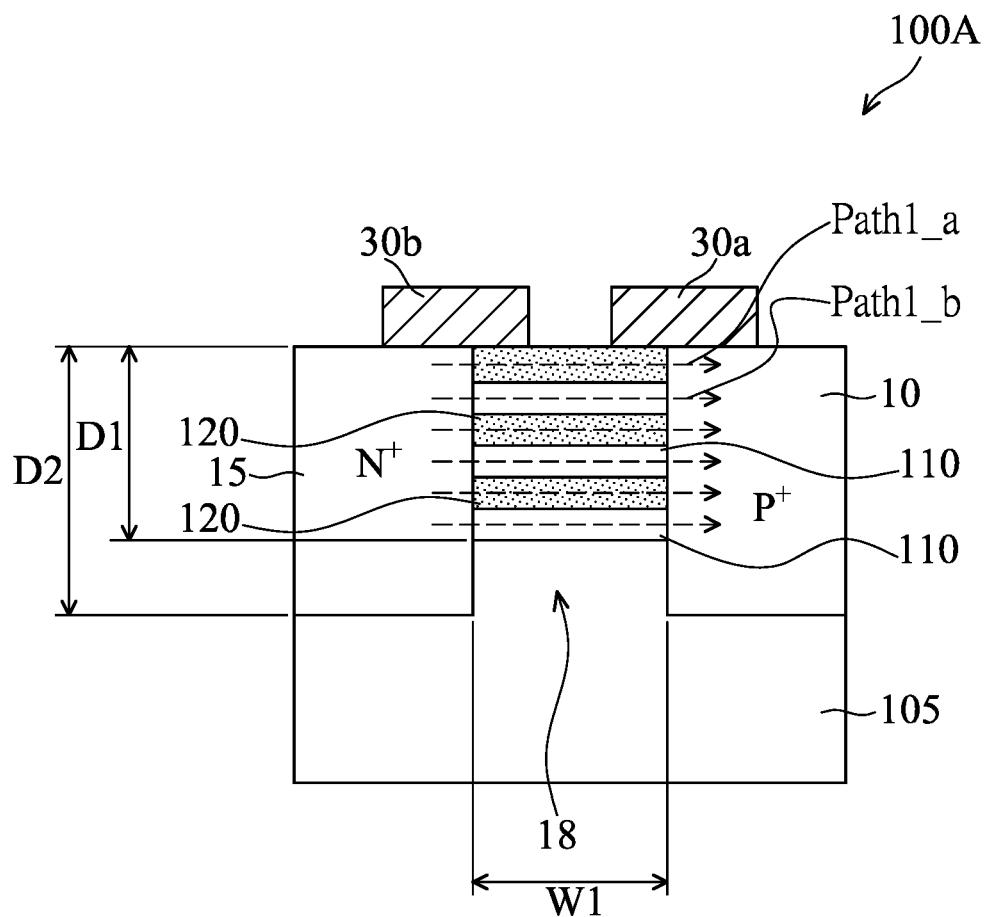
FIG. 2 shows a schematic cross-sectional view illustrating the ESD structure of the ESD device along line A-AA in FIG. 1, in accordance with some embodiments of the disclosure.

FIG. 2 shows a schematic cross-sectional view illustrating the ESD structure of the ESD device 100A along line A-AA in FIG. 1, in accordance with some embodiments of the disclosure. As described above, the P-type epitaxy region 10 and the N-type epitaxy region 15 are formed over the semiconductor substrate 105.

In the junction region 18, multiple semiconductor layers 110 and 120 are alternatingly stacked over the semiconductor substrate 105 and formed between the P-type epitaxy region 10 and the N-type epitaxy region 15. Furthermore, one side of each semiconductor layers 110 is in contact with the P-type epitaxy region 10, and an opposite side of each semiconductor layers 110 is in contact with the N-type epitaxy region 15. Similarly, one side of each semiconductor layers 120 is in contact with the P-type epitaxy region 10, and an opposite side of each semiconductor layers 120 is in contact with the N-type epitaxy region 15.

In some embodiments, the semiconductor layers 110 are the silicon layers, and the semiconductor layers 120 are the germanium layers, e.g., the SiGe layers. In some embodiments, the semiconductor layers 110 are the germanium layers (e.g., the SiGe layers), and the semiconductor layers 120 are the silicon layers. In some embodiments, the semiconductor layers 110 are formed by doping Ge into the Si-base semiconductor layer or formed by epitaxially growing SiGe or Ge material on the Si-base semiconductor layers 120 and then annealing.

In the ESD event, the electron diffusion current flows from the N-type epitaxy region 15 to the P-type epitaxy region 10 through multiple ESD current paths Path 1_a and Path 1_b. In such embodiments, the ESD current path Path 1_a represents a current flowing from the N-type epitaxy region 15 to the P-type epitaxy region 10 through the semiconductor layer 120 during the ESD event, and the ESD current path Path 1_b represents a current flowing from the N-type epitaxy region 15 to the P-type epitaxy region 10 through the semiconductor layer 110 during the ESD event. Since the semiconductor layers 110 and 120 have different mobility caused by different materials, the current value and/or speed in the ESD current paths Path 1_a and Path 1_b are different.

In some embodiments, the P-type epitaxy region 10 and the N-type epitaxy region 15 have the same depth D2. Furthermore, a depth D1 of the stacked semiconductor layers 110 and 120 is less than the depth D2 of the P-type epitaxy region 10 and the N-type epitaxy region 15.

In FIG. 2, the electrode 30a is formed over the interface between the junction region 18 and the P-type epitaxy region 10, and the electrode 30a is configured to partially cover the junction region 18 and the P-type epitaxy region 10. Similarly, the electrode 30b is formed over the interface between the junction region 18 and the N-type epitaxy region 15, and the electrode 30b is configured to partially cover the junction region 18 and the N-type epitaxy region 15. The electrodes 30a and 30b are used to provide process empty space, and no signal is applied to the electrodes 30a and 30b, i.e., the electrodes 30a and 30b are floating.

In a traditional ESD device, the N-type well region is used to form the cathode of the diode and the P-type well region is used to form the anode of the diode. Compared with the traditional ESD device, no P-type or N-type well region is used in the ESD device 100A. Therefore, the ESD device 100A is suitable for the IC with the backside structure because no bulk is required for the transistors in the IC.

Figure 3:
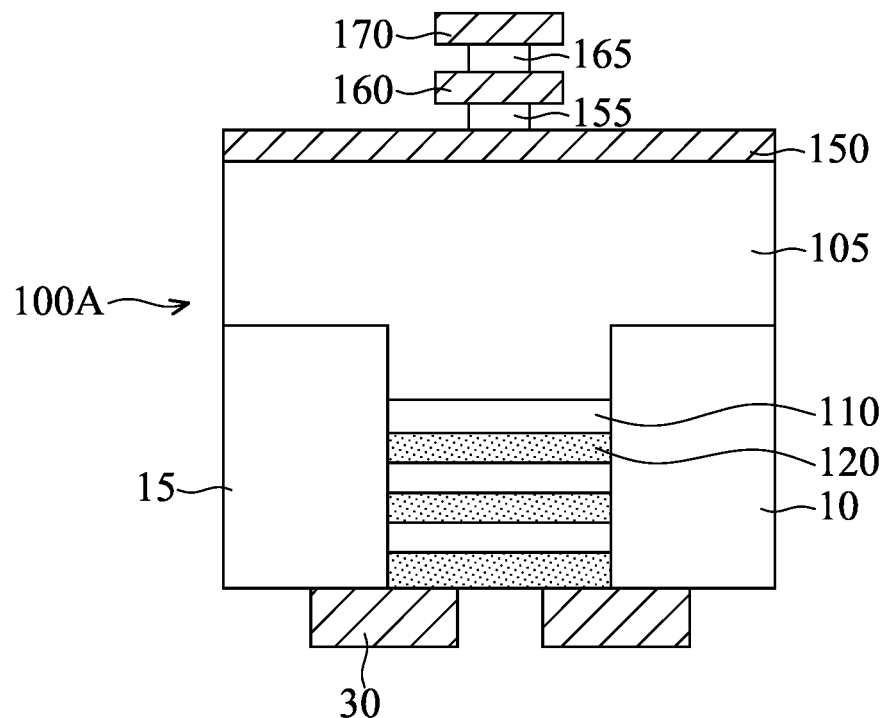
FIG. 3 shows a cross-sectional view illustrating the semiconductor structure of an IC with the ESD device of FIG. 1, in accordance with some embodiments of the disclosure.

FIG. 3 shows a cross-sectional view illustrating the semiconductor structure of an IC 200A with the ESD device 100A, in accordance with some embodiments of the disclosure. In FIG. 3, the IC 200A is formed by a super power rail (SPR) process so as to form the power rail and/or the metal in the backside of semiconductor substrate 105 of the IC 200A.

In some embodiments, after the ESD device 100A is formed, the semiconductor substrate 105 is turned 180 degrees to make the ESD device 100A face down. Next, the metal line 150 is formed over the backside of the semiconductor substrate 105. A via 155 is formed over the metal line 150, and then a metal line 160 is formed over the via 155. Next, A via 165 is formed over the metal line 160, and then a metal line 170 is formed over the via 165.

The metal lines 150, 160 and 170 are formed in different metal levels. In some embodiments, the metal line 150 is configured to connect a power line through the via 155, the metal line 160, the via 165 and the metal line 170 in sequence. In some embodiments, the metal line 150 is configured to connect a ground line through the via 155, the metal line 160, the via 165 and the metal line 170 in sequence. In some embodiments, the metal lines 150, 160 and 170 and the electrode 30 are formed by the same conductive material.

Figure 4:
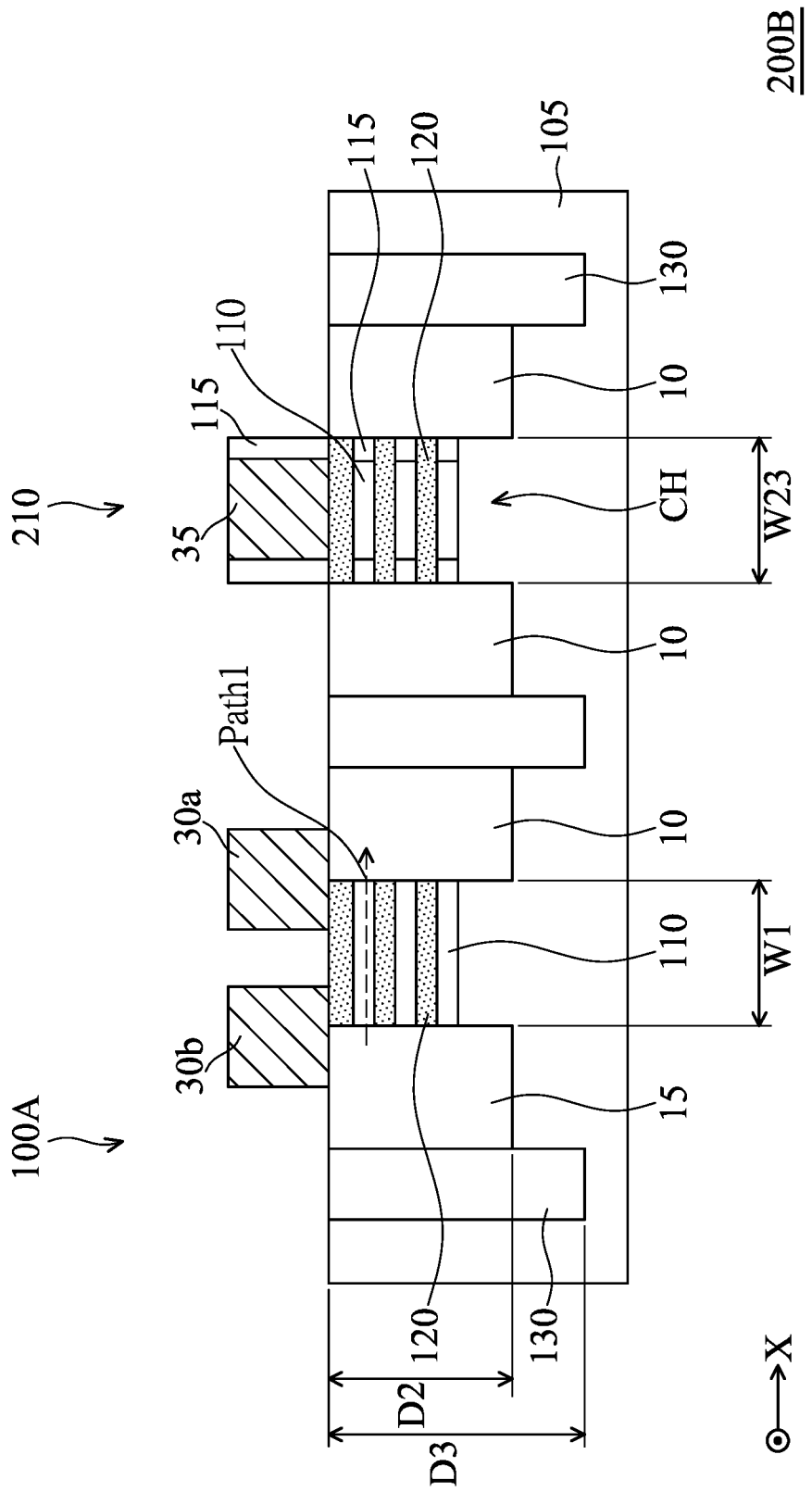
FIG. 4 shows a cross-sectional view illustrating the semiconductor structure of an IC with the ESD device of FIG. 1, in accordance with some embodiments of the disclosure.

FIG. 4 shows a cross-sectional view illustrating the semiconductor structure of an IC 200B with the ESD device 100A, in accordance with some embodiments of the disclosure. In the IC 200B, the ESD device 100A is capable of providing ESD protection for the transistor 210. The ESD device 100A is separated from the transistor 210 by the STI 130. The transistor 210 is a GAA transistor. In some embodiments, a depth of the STI region 130 is greater than the depth D2 of the P-type epitaxy region 10 and the N-type epitaxy region 15.

In FIG. 4, the transistor 210 is a P-type transistor. In the transistor 210, two P-type epitaxy regions 10 are formed over the semiconductor substrate 105. One of the P-type epitaxy regions 10 on the left is configured as the drain region of the transistor 210, and the other P-type epitaxy region 10 is configured as the source region of the transistor 210. For example, the P-type epitaxy region 10 on the left is configured as the drain region of the transistor 210, and the P-type epitaxy region 10 on the right is configured as the source region of the transistor 210. A channel region CH of the transistor 210 is formed by alternatingly stacked the semiconductor layers 110 and 120 over the semiconductor substrate 105. In some embodiments, the semiconductor layers 110 are the silicon layers, and the semiconductor layers 120 are the germanium layers, e.g., the SiGe layers. In some embodiments, the semiconductor layers 110 are the germanium layers (e.g., the SiGe layers), and the semiconductor layers 120 are the silicon layers. In FIG. 4, each semiconductor layer 120 may be a nanowire or nanosheet that forms a channel for the transistor 210.

In some embodiments, the transistor 210 is an N-type transistor. In such embodiments, two N-type epitaxy regions 15 (not shown) are formed over the semiconductor substrate 105 in the transistor 210. One of the N-type epitaxy regions 15 on the left is configured as the drain region of the transistor 210, and the other N-type epitaxy region 15 is configured as the source region of the transistor 210.

In the channel region CH, one side of each semiconductor layers 120 is in contact with the P-type epitaxy region 10 on the left, and an opposite side of each semiconductor layers 120 is in contact with the P-type epitaxy region 10 on the right. Compared with the ESD device 100A, the semiconductor layers 110 of the channel region CH is separated from the P-type epitaxy regions 10 by the spacers 115. In other words, one side of each semiconductor layers 110 is in contact with the spacer 115 on the left, and an opposite side of each semiconductor layers 120 is in contact with the spacer 115 on the right.

In the transistor 210, the distance of the channel region CH between the P-type epitaxy regions 15 (e.g., along the X direction) is W23. In some embodiments, the width W1 of the ESD device 100A is equal to the distance W23 of the transistor 210. In some embodiments, the width W1 of the ESD device 100A is greater than the distance W23 of the transistor 210.

The transistor 210 further includes a gate structure 140 over the channel region CH. In order to simplify the description, some layers (e.g., the gate dielectric layer) of the transistor 210 are omitted in FIG. 4. The gate structure 140 includes a gate electrode 35 and the spacers 115. The gate electrode 35 is connected to an overlying level (not shown) through a via (not shown). Furthermore, the semiconductor layers 120 are wrapped by the gate electrode 35.

In some embodiments, the gate electrode 35 and the electrode 30 are formed by the same conductive material, such as aluminum (Al), copper (Cu), tungsten (W), titanium (Ti), tantalum (Ta), or other applicable materials. In some embodiments, the gate electrode 35 includes multiple material structure selected from a group consisting of poly gate/SiON structure, metals/high-K dielectric structure, Al/refractory metals/high-K dielectric structure, silicide/high-K dielectric structure, or combination.

In the IC 200B, compared with the transistor 210, no gate structure is formed in the ESD device 100A. Furthermore, no spacer is formed in the ESD device 100A. Moreover, the electrodes 30 (i.e., 30a and 30b) are arranged to partially cover the P-type epitaxy region 10 and the N-type epitaxy region 15 of the ESD device 100A. However, in the transistor 210, the gate structure is completely formed over the channel region CH.

Figure 5:
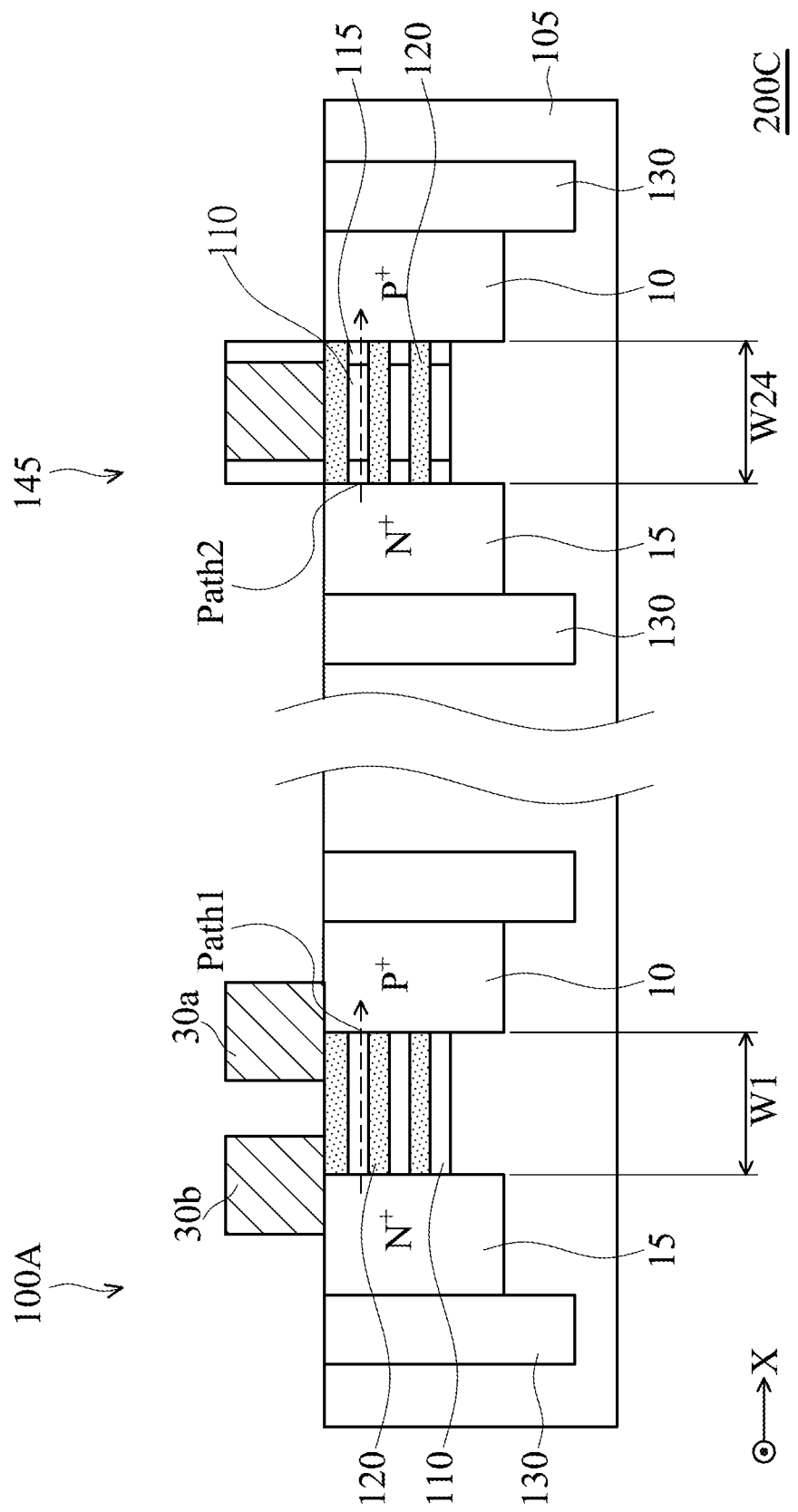
FIG. 5 shows a cross-sectional view illustrating the semiconductor structure of an IC with the ESD device of FIG. 1, in accordance with some embodiments of the disclosure.

FIG. 5 shows a cross-sectional view illustrating the semiconductor structure of an IC 200C with the ESD device 100A, in accordance with some embodiments of the disclosure. In the IC 200C, the ESD device 100A is capable of providing ESD protection for the corresponding devices (e.g., the transistor 210 of FIG. 4). Moreover, the IC 200C further the ESD device 145 that is capable of providing ESD protection for the other devices (not shown).

The ESD device 100A is separated from the ESD device 145 by the STI 130 and other devices (not shown). The ESD device 145 has the configuration similar to the transistor 210 of FIG. 4. The difference between the ESD device 145 and the transistor 210 is that one of the P-type epitaxy regions 10 of the transistor 210 is replaced with the N-type epitaxy region 15 to form the ESD device 145.

ESD current paths Path1 and Path2 are schematic representations that are superimposed in FIG. 5 to indicate how an electron diffusion current may be directed in an ESD event according to the embodiment shown in FIG. 5. In the ESD device 100A, the ESD current path Path1 represents a current that may be generated by an ESD event. Furthermore, in the ESD device 145, the ESD current path Path2 represents a current that may be generated by the ESD event.

Compared with the ESD device 145, no spacer 115 is formed on the two sides of the semiconductor layers 110 of the ESD device 100A, i.e., the spacer 115 is absent in the ESD current path Path1. Thus, the current characteristics (current value or speed) in the ESD current path Path1 of the ESD device 100A is better than that in the ESD current path Path2 of the ESD device 145 since the spacers 115 is present in the ESD current path Path2 of the ESD device 145. In other words, the ESD device 100A is capable of providing better ESD protection.

In the ESD device 145, the distance between the P-type epitaxy region 10 and the N-type epitaxy region (e.g., along the X direction) 15 is W24. In some embodiments, the width W1 of the ESD device 110A is equal to the distance W24 of the ESD device 145. In some embodiments, the width W1 of the ESD device 110A is greater than the distance W24 of the ESD device 145.

In FIG. 4 and FIG. 5, after forming the stacked semiconductor layers 110 and 120 of the junction region 18, the P-type epitaxy region 10 and the N-type epitaxy region 15 of the ESD device 100A, one or more masks are used to block subsequent processes for the junction region 18, e.g., no strained source/drain (SSD) etch. Thus, no spacer 115 is formed in the junction region 18 and then no gate structure is formed over the junction region 18. The ESD device 100A can be formed without following the GAA process, e.g., the transistor 210 of FIG. 4 and the ESD device 145 of FIG. 5 are formed according to the operations of the GAA process. In other words, the ESD device 100A does not need to meet the specifications of GAA device. For example, the ESD device 100A may has larger OD region 20 than the transistor 210 of FIG. 4 and the ESD device 145 of FIG. 5. When the size of the OD region 20 of the ESD device 100A is increased, the size of the diode of the ESD device 100A is increased.

Figure 6:
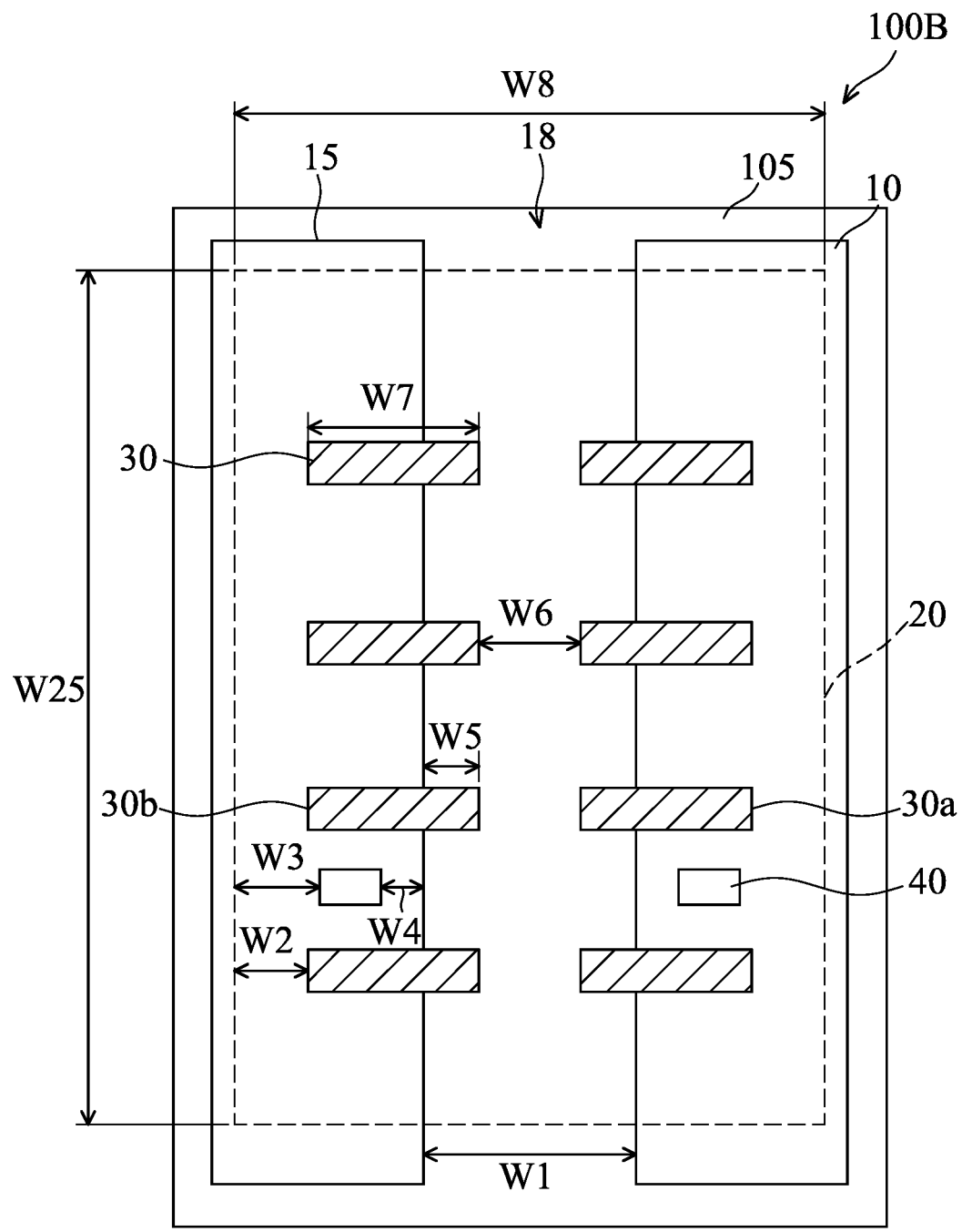
FIG. 6 shows a top view of an ESD device, in accordance with some embodiments of the disclosure.

FIG. 6 shows a top view of an ESD device 100B, in accordance with some embodiments of the disclosure. The ESD device 100B is formed over the semiconductor substrate 105. The ESD device 100B includes a diode (not shown) for ESD protection. The P-type epitaxy region 10 is formed over the semiconductor substrate 105, and the P-type epitaxy region 10 is configured as the anode of the diode. Furthermore, an N-type epitaxy region 15 is formed over the semiconductor substrate 105, and the N-type epitaxy region 15 is configured as the cathode of the diode.

The ESD device 100B of FIG. 6 has the configuration similar to the ESD device 100A of FIG. 1. The difference between the ESD devices 100A and 100B is that the contact 40 on the left is formed over the N-type epitaxy regions 15, and the contact 40 on the right is formed over the P-type epitaxy regions 10 in the ESD device 100B of FIG. 6.

The process limitation of features is described in FIG. 6, and the features within the OD region 20 should be considered in order to determine the minimum size of the OD region 20. The distance from one end of the electrode 30 to the boundary of the OD region 20 is W2. The distance from one end of the contact 40 to the boundary of the OD region 20 is W3, and the distance from the other end of the contact 40 to the boundary of the N-type epitaxy region 15 is W4. In some embodiments, distance W2 is less than distance W3 and distance W4. In some embodiments, distance W3 and distance W4 are equal.

In FIG. 6, the distance from the boundary of the N-type epitaxy region 15 to the other end of the electrode 30 is W5. In some embodiments, distance W5 is less than or equal to distance W2. Furthermore, a portion of the electrode 30 over the junction region 18 is shorter than the remaining portion of the electrode 30 over the N-type epitaxy region 15 or the P-type epitaxy region 10. Furthermore, the electrodes 30 in the ESD device 100B have a width of W30. The distance from electrode 30a to electrode 30b is W6. In some embodiments, distance W6 is greater than distance W2 and distance W5, and distance W6 is less than distance W3 and distance W4.

In FIG. 6, the length of the electrodes 30 is W7. In some embodiments, the length W7 is greater than the distance W1. In some embodiments, the width of the contact 40 is greater than or equal to the width W30 of the electrode 30, and the length of the contact 40 is less than the length W7 of the electrode 30. In some embodiments, the OD region 20 has a width W8 and a length W25. The width W8 of the OD region 20 is determined by adding twice the distance W2, twice the length W7, and the distance W6. Therefore, according to the minimum distance W2, the minimum length W7, and the minimum distance W6, the minimum width of the OD region 20 is obtained. In some embodiments, the minimum width of the OD region 20 is greater than the maximum width of the OD region of the GAA transistor (e.g., the transistor 210 of FIG. 4 and ESD device 145 of FIG. 5).

In some embodiments, when the area of the OD region 20 or the P-type epitaxy region 10 and the N-type epitaxy region 15 of the ESD device 100B is increased, the diode size of the ESD device 100B is increased. In some embodiments, the diode size of the ESD device 100B is increased by mirror the ESD device 100B in FIG. 6 along the X direction or the Y direction.

Figure 7:
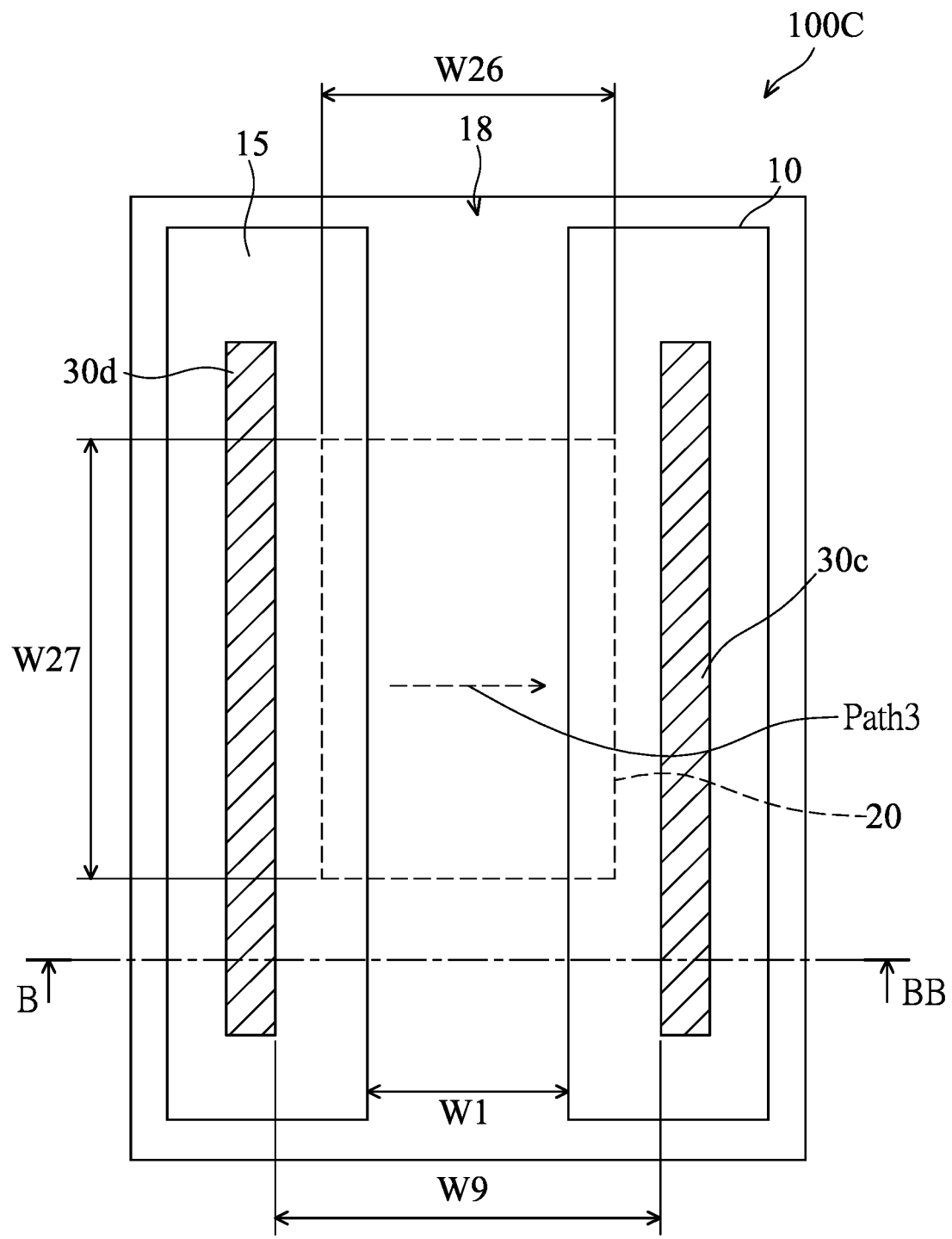
FIG. 7 shows a top view of an ESD device, in accordance with some embodiments of the disclosure.

FIG. 7 shows a top view of an ESD device 100C, in accordance with some embodiments of the disclosure. The ESD device 100C is formed over the semiconductor substrate 105. The ESD device 100C includes a diode (not shown) for ESD protection. A P-type epitaxy region 10 is formed over the semiconductor substrate 105, and the P-type epitaxy region 10 is configured as the anode of the diode. Furthermore, an N-type epitaxy region 15 is formed over the semiconductor substrate 105, and the N-type epitaxy region 15 is configured as the cathode of the diode. It should be noted that the P-type epitaxy region 10 is separated from the N-type epitaxy region 15 by a junction region 18. In the ESD device 100C, the distance of the junction region 18 from the P-type epitaxy region 10 to the N-type epitaxy region 15 is W1.

The electrodes 30d and 30e are formed over the diode of the ESD device 100C. In some embodiments, the material of the electrodes 30d and 30e is similar to the metal gate of the transistors to be protected by the ESD device 100C, and the transistors and the ESD device 100C are formed over the semiconductor substrate 105 in the same IC. The electrode 30c is formed over the P-type epitaxy region 10, and the electrode 30d is formed over the N-type epitaxy region 15. In some embodiments, the electrodes 30d and 30e do not affect the function or operation of the diode of the ESD device 100C. For example, the electrodes 30d and 30e is arranged based on process considerations for subsequent processes, such as balance for chemical mechanical polishing (CMP) of the IC.

The P-type epitaxy region 10 is coupled to a ground line through a contact (not shown in FIG. 7) within the OD region 20. Moreover, the N-type epitaxy region 15 is coupled to a power line through another contact (not shown in FIG. 7) within the OD region 20. In some embodiments, the OD region is used as an active region for an transistor. In some embodiments, the OD region is defined by the STI regions of the ESD device 100C. In some embodiments, the contact is a metal to diffusion (MD) contact.

The OD region 20 has a width W26 and a length W27. The distance W9 between electrodes 30d and 30e is greater than the width W26 of the OD region 20. Therefore, the electrodes 30d and 30e are formed outside of the OD region 20. Furthermore, the length of the electrodes 30d and 30e is greater than the length W27 of the OD region 20. In some embodiments, the electrodes 30d and 30e in the ESD device 100C have a larger width than the width W30 of the electrodes 30 of the ESD device 100B in FIG. 6. In the ESD device 100C, no electrode 30 is formed within the OD region 20. Thus, the size of the OD region 20 will not be limited by the electrodes 30. In some embodiments, the OD region 20 of the ESD device 100C is larger than the OD region 20 of the ESD device 100B in FIG. 6.

ESD current path Path3 is a schematic representation to indicate how an electron diffusion current may be directed in an ESD event according to the embodiment shown in FIG. 7. In the ESD device 100C, the ESD current path Path3 represents a current that may be generated by an ESD event. The ESD current path Path3 flows from the N-type epitaxy region 15 which is considered to be at one electrical node, to the P-type epitaxy region 10 which is considered to be at another electrical node in the ESD event.

In some embodiments, when the area of the OD region 20 or the P-type epitaxy region 10 and the N-type epitaxy region 15 of the ESD device 100C is increased, the diode size of the ESD device 100C is increased. In some embodiments, the diode size of the ESD device 100C is increased by mirror the ESD device 100C in FIG. 7 along the X direction or the Y direction.

Figure 8:
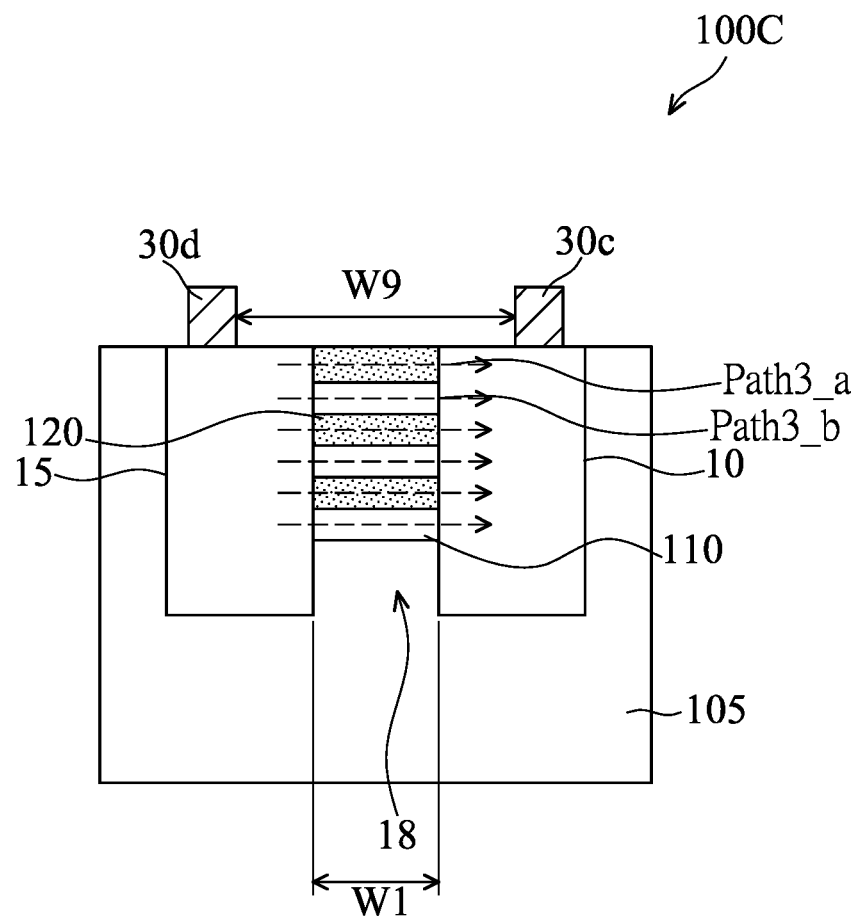
FIG. 8 shows a schematic cross-sectional view illustrating the structure of the ESD device along line B-BB in FIG. 7, in accordance with some embodiments of the disclosure.

FIG. 8 shows a schematic cross-sectional view illustrating the structure of the ESD device 100C along line B-BB in FIG. 7, in accordance with some embodiments of the disclosure. As described above, the P-type epitaxy region 10 and the N-type epitaxy region 15 are formed over the semiconductor substrate 105.

In the junction region 18, multiple semiconductor layers 110 and 120 are alternatingly stacked over the semiconductor substrate 105 and between the P-type epitaxy region 10 and the N-type epitaxy region 15. In some embodiments, the semiconductor layers 110 are the silicon layers, and the semiconductor layers 120 are the germanium layers, e.g., the SiGe layers. In some embodiments, the semiconductor layers 110 are the germanium layers (e.g., the SiGe layers), and the semiconductor layers 120 are the silicon layers. In some embodiments, the semiconductor layers 110 are formed by doping Ge into the Si-base semiconductor layer or formed by epitaxially growing SiGe or Ge material on the Si-base semiconductor layers 120 and then annealing. Furthermore, one side of each semiconductor layers 110 is in contact with the P-type epitaxy region 10, and an opposite side of each semiconductor layers 110 is in contact with the N-type epitaxy region 15. Similarly, One side of each semiconductor layers 120 is in contact with the P-type epitaxy region 10, and an opposite side of each semiconductor layers 120 is in contact with the N-type epitaxy region 15.

When the ESD event is present, the electron diffusion current flows from the N-type epitaxy region 15 to the P-type epitaxy region 10 through multiple ESD current paths Path3_a and Path3_b. In such embodiments, the ESD current path Path3_a represents a current flowing through the semiconductor layer 120 during the ESD event, and the ESD current path Path3_b represents a current flowing through the semiconductor layer 110 during the ESD event. Since the semiconductor layers 110 and 120 have different mobility caused by different materials, the current value and/or speed in the ESD current paths Path3_a and Path3_b are different.

In FIG. 8, the electrode 30c is formed over the P-type epitaxy region 10, and the electrode 30d is formed over the N-type epitaxy region 15. The electrodes 30c and 30d are used to provide process empty space, and no other signal is applied to the electrodes 30c and 30d, i.e., the electrodes 30c and 30d are floating. Similarly, no P-type or N-type well region is used in the ESD device 100C. Therefore, the ESD device 100C is suitable for the IC with the backside structure because no bulk is required for the GAA transistors in the IC.

Figure 9:
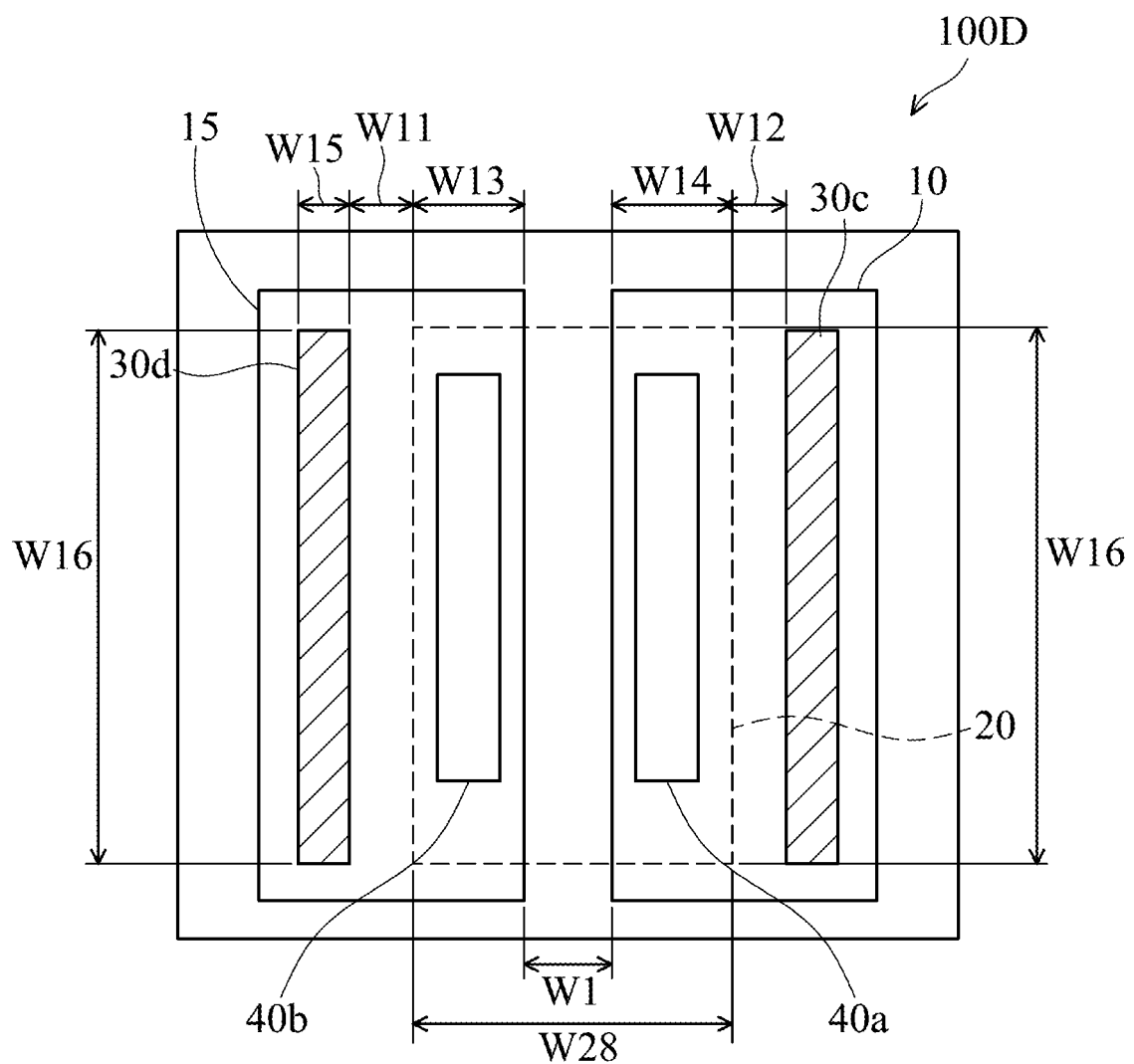
FIG. 9 shows a top view of an ESD device, in accordance with some embodiments of the disclosure.

FIG. 9 shows a top view of an ESD device 100D, in accordance with some embodiments of the disclosure. The ESD device 100D is formed over the semiconductor substrate 105. The ESD device 100D includes a diode (not shown) for ESD protection. The P-type epitaxy region 10 is formed over the semiconductor substrate 105, and the P-type epitaxy region 10 is configured as the anode of the diode. Furthermore, an N-type epitaxy region 15 is formed over the semiconductor substrate 105, and the N-type epitaxy region 15 is configured as the cathode of the diode.

The ESD device 100D of FIG. 9 has the configuration similar to the ESD device 100C of FIG. 7. The difference between the ESD devices 100C and 100D is that the contact 40b is formed over the N-type epitaxy regions 15 within the OD region 20, and the contact 40a is formed over the P-type epitaxy regions 10 within the OD region 20.

The process limitation of features is described in FIG. 9, and the features should be considered in order to determine the minimum size of the OD region 20. The distance from the electrode 30d to the boundary of the OD region 20 is W11, and the distance from the electrode 30c to the boundary of the OD region 20 is W12. In some embodiments, distance W11 is less than distance W12. In some embodiments, distance W11 is equal to distance W12. In some embodiments, the width W14 of the P-type epitaxy region 10 within the OD region 20 is greater than or equal to the width W1 of the junction region 18, i.e., W14≥W1. Moreover, the width W13 of the N-type epitaxy region 15 within the OD region 20 is greater than or equal to the width W1 of the junction region 18, i.e., W13≥W1. In some embodiments, width W13 is different than width W14. In some embodiments, width W13 is equal to width W14.

In FIG. 9, the width W28 of the OD region 20 is determined by the widths W13, W1 and W14. In some embodiments, the electrodes 30c and 30d and the OD region 20 are the same length W16. Furthermore, the width of the electrodes 30c and 30d is W15. In some embodiments, the width W15 of the electrodes 30c and 30d is greater than the width W30 of the electrodes 30 in FIG. 6. In some embodiments, the minimum width of the OD region 20 is obtained according to the minimum widths W13, W1 and W14. As described above, the minimum width of the OD region 20 is greater than the maximum width of the OD region of the GAA transistor.

In some embodiments, when the area of the OD region 20 or the P-type epitaxy region 10 and the N-type epitaxy region 15 of the ESD device 100D is increased, the diode size of the ESD device 100D is increased. In some embodiments, the diode size of the ESD device 100D is increased by mirroring the ESD device 100D in FIG. 9 along the X direction or the Y direction.

Embodiments of the ESD device are provided. In the ESD device (e.g., the ESD device 100A-100D) of the embodiments, no gate structure is formed, thereby decreasing the gated parasitic capacitance for the ESD device. The parasitic capacitance will seriously interfere with the signal transmission and thus affect the performance of the IC. Furthermore, no spacer is formed in the ESD device, and the electron diffusion current caused by the ESD event will not be affected by the inner spacer in a traditional ESD device. Compared with a traditional ESD device that is similar to the GAA transistor, the ESD devices of the embodiments have a larger OD region, so as to provide a larger diode for ESD protection.

In some embodiments, an electrostatic discharge (ESD) structure is provided. The ESD structure includes a semiconductor substrate, a first epitaxy region with a first type of conductivity over the semiconductor substrate, a second epitaxy region with a second type of conductivity over the semiconductor substrate, a plurality of first semiconductor layers and a plurality of second semiconductor layers, a first conductive feature, and a second conductive feature. The first semiconductor layers and the second semiconductor layers are alternatingly stacked over the semiconductor substrate and between the first and second epitaxy regions. The first conductive feature is formed over the first epitaxy region and outside an oxide diffusion region. The second conductive feature is formed over the second epitaxy region and outside the oxide diffusion region. The oxide diffusion region is disposed between the first and second conductive features.

In some embodiments, an electrostatic discharge (ESD) structure is provided. The ESD structure includes a semiconductor substrate, a first epitaxy region with a first type of conductivity over the semiconductor substrate, a second epitaxy region with a second type of conductivity over the semiconductor substrate, a plurality of Si layers and a plurality of SiGe layers, a first conductive feature formed over the first epitaxy region and outside an oxide diffusion region, and a second conductive feature formed over the first epitaxy region and within the oxide diffusion region. The Si layers and the SiGe layers are alternatingly stacked over the semiconductor substrate and between the first and second epitaxy regions. The first conductive feature is floating, and the second conductive feature is configured to couple a ground line or a power line to the first epitaxy region.

In some embodiments, an electrostatic discharge (ESD) structure is provided. The ESD structure includes a semiconductor substrate, a first epitaxy region with a first type of conductivity over the semiconductor substrate, a second epitaxy region with a second type of conductivity over the semiconductor substrate, a junction region over the semiconductor substrate and between the first and second epitaxy regions, a plurality of Si layers and a plurality of SiGe layers alternatingly stacked in the junction region, a first electrode formed over the first epitaxy region and outside an oxide diffusion region, a second electrode formed over the first epitaxy region and within the oxide diffusion region, a third electrode formed over the second epitaxy region and outside the oxide diffusion region, and a fourth electrode formed over the second epitaxy region and within the oxide diffusion region. An interface between the stacked Si and SiGe layers and the semiconductor substrate is higher than an interface between the first epitaxy region and the semiconductor substrate.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electrostatic discharge (ESD) structure, comprising:
a semiconductor substrate;
a first epitaxy region with a first type of conductivity over the semiconductor substrate;
a second epitaxy region with a second type of conductivity over the semiconductor substrate;
a plurality of Si layers and a plurality of SiGe layers alternatingly stacked over the semiconductor substrate and between the first and second epitaxy regions;
a first conductive feature formed over the first epitaxy region and outside an oxide diffusion region;
a second conductive feature formed over the second epitaxy region and outside the oxide diffusion region;
a third conductive feature formed over the first epitaxy region and within the oxide diffusion region; and
a fourth conductive feature formed over the second epitaxy region and within the oxide diffusion region,
wherein the oxide diffusion region is disposed between the first and second conductive features.

2. The ESD structure as claimed in claim 1, wherein a first depth of the first and second epitaxy regions is greater than a second depth of the stacked Si and SiGe layers.

3. The ESD structure as claimed in claim 1, wherein the first and second conductive features have the same length, and a length of the first conductive feature is greater than or equal to a length of the oxide diffusion region.

4. The ESD structure as claimed in claim 1, wherein the first and second conductive features have the same width, and a width of the first conductive feature is less than a width of the oxide diffusion region.

5. The ESD structure as claimed in claim 1, wherein the third and fourth conductive features are shorter than the first and second conductive features.

6. The ESD structure as claimed in claim 1, wherein the first epitaxy region has P-type conductivity and the second epitaxy region has N-type conductivity, and the third conductive feature is configured to couple a ground line to the first epitaxy region and the fourth conductive feature is configured to couple a power line to the second epitaxy region.

7. The ESD structure as claimed in claim 1, wherein the first epitaxy region has N-type conductivity and the second epitaxy region has P-type conductivity, and the third conductive feature is configured to couple a power line to the first epitaxy region and the fourth conductive feature is configured to couple a ground line to the second epitaxy region.

8. The ESD structure as claimed in claim 1, wherein a width of the first epitaxy region within the oxide diffusion region and a width of the second epitaxy region within the oxide diffusion region are greater than a width between the first epitaxy region and the second epitaxy region.

9. An electrostatic discharge (ESD) structure, comprising:
a semiconductor substrate;
a first epitaxy region with a first type of conductivity over the semiconductor substrate;
a second epitaxy region with a second type of conductivity over the semiconductor substrate;
a plurality of Si layers and a plurality of SiGe layers alternatingly stacked over the semiconductor substrate and between the first and second epitaxy regions;
a first conductive feature formed over the first epitaxy region and outside an oxide diffusion region;
a second conductive feature formed over the first epitaxy region and within the oxide diffusion region;
a third conductive feature formed over the second epitaxy region and outside the oxide diffusion region; and
a fourth conductive feature formed over the second epitaxy region and within the oxide diffusion region,
wherein the first conductive feature is floating, and the second conductive feature is configured to couple a ground line or a power line to the first epitaxy region.

10. The ESD structure as claimed in claim 9, wherein the oxide diffusion region is disposed between the first and second epitaxy regions.

11. The ESD structure as claimed in claim 9, wherein a length of the first conductive feature is greater than or equal to a length of the oxide diffusion region, and a length of the second conductive feature is less than the length of the oxide diffusion region.

12. The ESD structure as claimed in claim 9, wherein the first conductive feature is parallel to the second conductive feature.

13. The ESD structure as claimed in claim 9, wherein the second and fourth conductive features are shorter than the first and third conductive features.

14. The ESD structure as claimed in claim 9, wherein the first epitaxy region has P-type conductivity and the second epitaxy region has N-type conductivity, and the second conductive feature is configured to couple the ground line to the first epitaxy region and the fourth conductive feature is configured to couple the power line to the second epitaxy region.

15. The ESD structure as claimed in claim 9, wherein the first epitaxy region has N-type conductivity and the second epitaxy region has P-type conductivity, and the second conductive feature is configured to couple the power line to the first epitaxy region and the fourth conductive feature is configured to couple the ground line to the second epitaxy region.

16. The ESD structure as claimed in claim 9, wherein a first depth of the first and second epitaxy regions is greater than a second depth of the stacked Si and SiGe layers.

17. An electrostatic discharge (ESD) structure, comprising:
a semiconductor substrate;
a first epitaxy region with a first type of conductivity over the semiconductor substrate;
a second epitaxy region with a second type of conductivity over the semiconductor substrate;
a junction region over the semiconductor substrate and between the first and second epitaxy regions;
a plurality of Si layers and a plurality of SiGe layers alternatingly stacked in the junction region;
a first electrode formed over the first epitaxy region and outside an oxide diffusion region;
a second electrode formed over the first epitaxy region and within the oxide diffusion region;
a third electrode formed over the second epitaxy region and outside the oxide diffusion region; and
a fourth electrode formed over the second epitaxy region and within the oxide diffusion region,
wherein an interface between the stacked Si and SiGe layers and the semiconductor substrate is higher than an interface between the first epitaxy region and the semiconductor substrate.

18. The ESD structure as claimed in claim 17, wherein a width of the first epitaxy region within the oxide diffusion region and a width of the second epitaxy region within the oxide diffusion region are greater than a width of the junction region.

19. The ESD structure as claimed in claim 17, wherein the first and third electrodes are longer than the second and fourth electrodes.

20. The ESD structure as claimed in claim 17, wherein the first and third electrodes are floating, and the second and fourth electrodes are configured to couple a ground line and a power line to the first and second epitaxy regions, respectively.

* * * * *